(12) United States Patent
Kasahara et al.

(10) Patent No.: US 12,451,369 B2
(45) Date of Patent: Oct. 21, 2025

(54) PROCESSING LIQUID SUPPLY SYSTEM AND OPERATION METHOD THEREOF

(71) Applicant: Tokyo Electron Limited, Tokyo (JP)

(72) Inventors: Masatoshi Kasahara, Kumamoto (JP); Keiichiro Uchino, Kumamoto (JP); Sadamichi Mori, Kumamoto (JP); Naohiro Iwanaga, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 198 days.

(21) Appl. No.: 18/380,986

(22) Filed: Oct. 17, 2023

(65) Prior Publication Data

US 2024/0136204 A1    Apr. 25, 2024
US 2024/0234169 A9    Jul. 11, 2024

(30) Foreign Application Priority Data

Oct. 20, 2022    (JP) ................ 2022-168413

(51) Int. Cl.
    *H01L 21/67*    (2006.01)
    *B01D 35/02*    (2006.01)
    (Continued)

(52) U.S. Cl.
CPC ........ *H01L 21/67023* (2013.01); *B01D 35/02* (2013.01); *G05D 16/024* (2019.01); *G05D 16/208* (2013.01); *H01L 21/67017* (2013.01); *H01L 21/67051* (2013.01); *H01L 21/6708* (2013.01); *H01L 21/67098* (2013.01); *Y10T 137/86139* (2015.04)

(58) Field of Classification Search
CPC ......... H01L 21/67023; H01L 21/67017; H01L 21/67051; H01L 21/6708; H01L 21/67098; G05D 16/024; G05D 16/208; B01D 35/02; Y10T 137/86139; Y10T 137/86147; Y10T 137/86155
USPC ........................... 137/565.3, 565.31, 565.32
See application file for complete search history.

(56) References Cited

U.S. PATENT DOCUMENTS 412,643 A * 10/1889 Merralls .................. B03B 5/02
                                                                  209/208
3,908,693 A * 9/1975 Cooper .................. F16K 15/00
                                                                   137/493
(Continued)

FOREIGN PATENT DOCUMENTS

JP      2021-009956 A     1/2021

*Primary Examiner* — William M McCalister
(74) *Attorney, Agent, or Firm* — Venjuris, P.C.

(57) ABSTRACT

A processing liquid supply system includes a tank that stores a processing liquid supplied from a processing liquid supply, a circulation passage that is connected to the tank, a plurality of supply passages that is connected to the circulation passage and supplies the processing liquid to each of a plurality of liquid processing units that perform a liquid processing on a substrate, a first pump filter set that is a combination of a first pump and a plurality of first filters provided downstream of the first pump, and a second pump filter set that is a combination of a second pump and a plurality of second filters provided downstream of the second pump. The first pump filter set and the second pump filter set are arranged in series in the circulation passage such that the first pump filter set is located upstream of the second pump filter set.

14 Claims, 4 Drawing Sheets

(51) Int. Cl.
*G05D 16/00* (2006.01)
*G05D 16/20* (2006.01)

(56) References Cited

U.S. PATENT DOCUMENTS

| | | | |
|---|---|---|---|
| 5,507,307 A * | 4/1996 | Montegari | F02D 19/0628 208/182 |
| 6,206,036 B1 * | 3/2001 | Loyd | A61H 33/60 137/565.17 |
| 2005/0126968 A1 * | 6/2005 | Schmidt | F16N 39/06 210/167.04 |
| 2005/0274420 A1 * | 12/2005 | Lochtefeld | A63G 3/00 137/565.33 |
| 2006/0174828 A1 * | 8/2006 | Mekias | H01L 21/67017 118/66 |
| 2011/0226290 A1 * | 9/2011 | Xue | H05K 3/0085 134/109 |
| 2013/0220478 A1 * | 8/2013 | Kasahara | B65B 3/04 141/2 |
| 2014/0124418 A1 * | 5/2014 | Ishihara | B01D 29/66 210/86 |
| 2020/0211867 A1 * | 7/2020 | Maezono | B08B 3/08 |
| 2020/0346143 A1 * | 11/2020 | Park | B01D 29/52 |
| 2022/0037167 A1 * | 2/2022 | Yabuta | H01L 21/67028 |
| 2024/0136204 A1 * | 4/2024 | Kasahara | H01L 21/67017 |

* cited by examiner

PROCESSING LIQUID SUPPLY SYSTEM AND OPERATION METHOD THEREOF

CROSS-REFERENCE TO RELATED APPLICATIONS

The present application is based on and claims priority from Japanese Patent Application No. 2022-168413, filed on Oct. 20, 2022, with the Japan Patent Office, the disclosure of which is incorporated herein in its entirety by reference.

TECHNICAL FIELD

The present disclosure relates to a processing liquid supply system and an operation method thereof.

BACKGROUND

A process of manufacturing semiconductor devices includes a step of supplying a predetermined processing liquid to a processing target object such as a semiconductor wafer to perform a liquid processing such as cleaning or wet etching. Japanese Patent Laid-Open Publication No. 2021-009956 describes an example of a processing liquid supply system that supplies a processing liquid to a liquid processing unit for performing such a liquid processing in a liquid processing apparatus having a plurality of liquid processing units. The processing liquid supply system described in Japanese Patent Laid-Open Publication No. 2021-009956 includes a tank for storing the processing liquid and a circulation passage connected at both ends thereof to the tank. The circulation passage includes a main passage section provided with a pump and first and second branch passage sections branched off from the main passage section. The processing liquid flowing out from the tank passes through the main passage section and then enters into each branch passage section to thereby return to the tank through each branch passage section. The plurality of liquid processing units are grouped into a first processing unit group and a second processing unit group. The plurality of supply passages are grouped into a first passage group and a second passage group. Each liquid processing unit belonging to the first processing unit group is connected to the first branch passage section via the supply passage belonging to the first passage group, while each liquid processing unit belonging to the second processing unit group is connected to the second branch passage section via the supply passage belonging to the second passage group.

SUMMARY

According to an embodiment of the disclosure, a processing liquid supply system includes a tank that stores a processing liquid supplied from a processing liquid supply, a circulation passage that is connected to the tank, a plurality of supply passages that is connected to the circulation passage and supplies the processing liquid to each of a plurality of liquid processing units that perform a liquid processing on a substrate, a first pump filter set that is a combination of a first pump and a plurality of first filters provided downstream of the first pump, and a second pump filter set that is a combination of a second pump and a plurality of second filters provided downstream of the second pump. The first pump filter set and the second pump filter set are arranged in series in the circulation passage such that the first pump filter set is located upstream of the second pump filter set.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
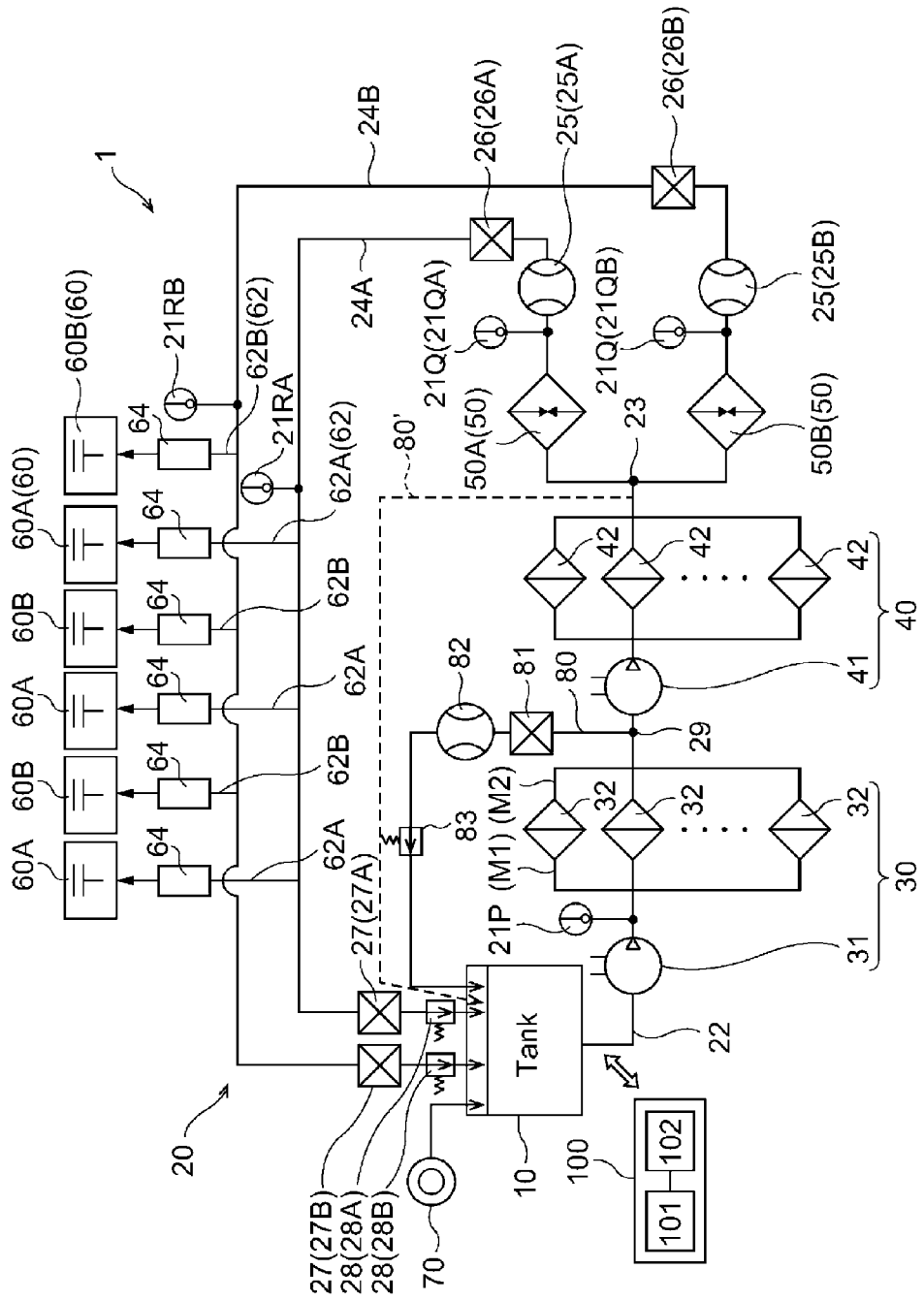
FIG. 1 is a piping layout diagram of a liquid processing apparatus having a processing liquid supply system according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Embodiments of a liquid processing apparatus will be described with reference to the accompanying drawings. In each drawing, the same reference numerals are given to the same or substantially the same members.

FIG. 1 is a piping layout diagram (fluid circuit diagram) of a liquid processing apparatus having a processing liquid supply system 1 according to a first embodiment. The liquid processing apparatus includes a plurality of liquid processing units 60 (60A and 60B) to which a processing liquid is supplied by the processing liquid supply system 1.

The liquid processing unit 60 is, for example, a single wafer type rotary liquid processing unit. The rotary liquid processing unit includes a substrate rotation and holding mechanism (referred to as a spin chuck, etc.) that holds a substrate such as a semiconductor wafer in a horizontal orientation and rotates the substrate around a vertical axis, and at least one nozzle that supplies the processing liquid supplied from the processing liquid supply system 1 to the substrate held by the substrate rotation and holding mechanism. Since a configuration of such a rotary liquid processing unit is well-known in the technical field of semiconductor manufacturing apparatuses, and thus, a detailed description thereof is omitted.

The processing liquid supply system 1 includes a tank 10 for storing the processing liquid supplied from a processing liquid supply 70 that supplies a raw material liquid (e.g., one or more types of chemical liquids and a diluent liquid such as pure water) for the blending of the processing liquid or the completely blended processing liquid, and a circulation passage 20 connected to the tank 10. The processing liquid supply 70 may include a tank (tank different from the tank 10) for storing the pre-blended processing liquid. The processing liquid supply 70 may supply a processing liquid made by mixing a plurality of components, or a single component processing liquid.

The circulation passage 20 includes an upstream-side main passage section (stem pipe section) 22 and a plurality of (two in the illustrated example) downstream-side branch passage sections (branch pipe sections) 24A and 24B (hereinafter, also referred to as "the first branch passage section 24A" and "the second branch passage section 24B").

It is not always necessary to branch the circulation passage 20 into the plurality of branch passage sections, and the main passage section 22 may extend directly to the tank 10.

In the following description within this specification, the character at the end of reference numerals given to components associated with the first branch passage section 24A is "A," and the character at the end of reference numerals given to components associated with the second branch passage section 24B is "B." The components associated with the first branch passage section 24A and the components associated with the second branch passage section 24B are either the same or substantially the same as each other. When there is no need to distinguish between the components associated with the first branch passage section 24A and the components associated with the second branch passage section 24B, the characters "A" and "B" at the end of reference numerals may be omitted (e.g., 40A and 40B may be written as 40). Further, the component with the character "A" at the end of reference numeral may be referred to "the first (component name)," and the component with the character "B" at the end of reference numeral may be referred to as "the second (component name)" Further, "the first~" and "the second~" may be omitted as well.

The main passage section 22 is provided with two pump filter sets (meaning sets of pumps and filters), i.e., an upstream-side first pump filter set 30 and a downstream-side second pump filter set 40. The first pump filter set 30 is composed of a first pump 31 and a plurality of first filters 32 provided in parallel downstream of the first pump 31. The second pump filter set 40 is composed of a second pump 41 and a plurality of second filters 42 provided in parallel downstream of the second pump 41. The filters 32 and 42 are used to remove contaminants such as particles from the processing liquid. A temperature sensor 21P is provided in the main passage section 22 between the first pump 31 and the plurality of first filters 32 of the first pump filter set 30.

In one appropriate embodiment, the first and second pumps 31 and 41 are rotary centrifugal pumps of the same specification, for example, magnetic levitation type bearingless centrifugal pumps. The magnetic levitation type bearing-less centrifugal pumps are suitable for use in the processing liquid supply system of semiconductor manufacturing apparatuses because they generate very few pump-induced particles despite being rotary pumps. Further, it is also advantageous to construct the processing liquid supply system 1 of FIG. 1 because even when two rotary pumps are connected in series, one rarely has a negative influence on the other.

However, it is also possible to adopt pumps other than the above type. For example, it is possible to configure a single pump assembly that does not substantially produce pulsations by arranging a plurality of reciprocating pumps (diaphragm pumps, bellows pumps, etc.) in parallel. An assembly of two pumps as mentioned above may be used instead of the first and second pumps 31 and 41 as long as they do not substantially produce pulsations. When the first and second pumps 31 and 41 are reciprocating pumps, it is possible to connect the first and second pumps 31 and 41 in series by providing a buffer tank or an accumulator between the first pump filter set 30 and the second pump filter set 40.

At a branching point (first branching point) 29 set between the first pump filter set 30 and the second pump filter set 40, a return passage 80 is branched off from the main passage section 22 to extend to the tank 10. The return passage 80 is provided with an on-off valve 81, a flow meter 82, and a back pressure valve 83 in order from the upstream side.

The main passage section 22 branches into the first branch passage section 24A and the second branch passage section 24A at a branching point (second branching point) 23 set at the downstream end thereof, i.e., downstream of the second pump filter set 40. The processing liquid flowing out from the tank 10 passes through the main passage section 22 and then enters the first and second branch passage sections 24A and 24B, finally returning to the tank 10 through the first and second branch passage sections 24A and 24B.

The liquid processing units 60 are grouped into the same number (two in the illustrated example) of groups as the branch passage sections 24A and 24B. The processing liquid is supplied to the liquid processing units 60A belonging to the first group from the first branch passage section 24A. Therefore, a plurality of supply passages 62 (62A) are branched off in parallel from the first branch passage section 24A and are connected to the respective liquid processing units 60A belonging to the first group. The processing liquid is supplied to the liquid processing units 60B belonging to the second group from the second branch passage section 24B. Therefore, a plurality of supply passages 62 (62B) are branched off in parallel from the second branch passage section 24B and are connected to the respective liquid processing units 60B belonging to the second group. The number of liquid processing units 60A or 60B belonging to each group is the same. In one embodiment, a plurality of liquid processing units 60A belonging to the first group are arranged on the left side of a substrate transfer area (not illustrated) in a processing block of the liquid processing apparatus, and a plurality of liquid processing units 60B belonging to the second group are arranged on the right side of the transfer area.

For the simplicity of illustration, FIG. 1 illustrates an example where three liquid processing units 60 belong to one group, but the number of processing units belonging to one group is not limited thereto. The number of processing units belonging to one group may be, for example, in the range of 6 to 10.

Each supply passage 62 is provided with a flow control device 64 represented by a white rectangular symbol. The flow control device 64 is constructed by appropriately combining devices such as an on-off valve, a flow control valve, a flow meter, and a liquid flow controller. The downstream end of the supply passage 62 is connected to a nozzle (not illustrated) that supplies the processing liquid to a substrate W. Thus, it is possible to supply the processing liquid from the nozzle to the substrate W loaded in the liquid processing unit 60 at a controlled flow rate.

The branch passage section 24A is provided with, in order from upstream, a temperature regulator 50 (50A), a temperature sensor 21Q (21QA), a flow meter 25 (25A), an on-off valve 26 (26A), an on-off valve 27 (27A), and a back pressure valve 28 (28A). Similarly, the branch passage section 24B is provided with, in order from upstream, a temperature regulator 50 (50B), a temperature sensor 21Q (21QB), a flow meter 25 (25B), an on-off valve 26 (26B), an on-off valve 27 (27B), and a back pressure valve 28 (28B).

The back pressure valve 28 is provided to maintain a constant pressure of the processing liquid flowing through an area of the branch passage sections 24A and 24B to which the plurality of liquid processing units 60 (60A and 60B) (supply passages 62 (62A and 62B)) are connected. Any type of valve with a variable opening degree may be provided in place of the back pressure valve 28 as long as it is capable of controlling the opening degree to fulfill this role.

The temperature regulator 50 (50A or 50B) regulates the temperature of the processing liquid passing therethrough. The temperature regulator 50 may be composed of a single temperature regulation module, or a plurality of temperature regulation modules arranged in parallel. The temperature regulation module may be a module dedicated only to heating such as a resistance heating heater or lamp heater, or may be a heating/cooling module capable of both heating and cooling, which has a temperature regulation element (e.g., Peltier element). The number of temperature regulation modules belonging to one temperature regulator 50 may be determined in consideration of the temperature regulation capability required for the temperature regulator 50 and the allowable pressure drop in the temperature regulator 50, among others.

The liquid processing apparatus includes a controller 100. The controller 100 is, for example, a computer, and has a control processing unit 101 and a storage 102. The storage 102 stores programs that control various processings executed in the liquid processing apparatus. The control processing unit 101 controls operations of various components of the liquid processing apparatus by reading and executing the programs stored in the storage 102. The programs may be recorded on a computer readable storage medium and may be installed from such a storage medium into the storage 102 of the controller 100. Examples of the computer readable storage medium include a hard disk (HD), a flexible disk (FD), a compact disk (CD), a magneto-optical disk (MO), and a memory card.

The controller 100 controls a temperature regulation operation (heating operation and/or cooling operation) of the temperature regulator 50A based on the detected temperatures of a temperature sensor 21P near the outlet of the pump 31, the temperature sensor 21QA near the outlet of the temperature regulator 50A, and a temperature sensor 21RA immediately upstream of a connection area of the first branch passage section 24A to the supply passage 62A, thereby maintaining the temperature of the processing liquid supplied from the first branch passage section 24A to the liquid processing unit 60A at a target value.

Likewise, the controller 100 controls a temperature regulation operation (heating operation and/or cooling operation) of the temperature regulator 50B based on the detected temperatures of the temperature sensor 21P near the outlet of the pump 31, the temperature sensor 21QB near the outlet of the temperature regulator 50B, and a temperature sensor 21RB immediately upstream of a connection area of the second branch passage section 24B to the supply passage 62B, thereby maintaining the temperature of the processing liquid supplied from the second branch passage section 24B to the liquid processing unit 60B at a target value.

According to the above embodiment, the processing liquid pumped by the first pump 31 of the upstream-side first pump filter set 30 experiences a pressure drop as it passes through (the plurality of) first filters 32. The pressure-reduced processing liquid is then increased in pressure and pumped by the second pump 41 of the downstream-side second pump filter set 40, and passes through (the plurality of) second filters 42. This cycle of pressure increase by the pump and pressure drop by the filters is repeated. As such, by providing a plurality of pump filter sets (two sets in the illustrated example) 30 and 40 in series, it is possible to flow the processing liquid through the circulation passage 20 at a desired flow rate with highly precise control even when the viscosity of the processing liquid is high. Further, when performing multi-stage filtration, it is possible to perform a management with a sufficient margin for the pressure tolerance of the respective filters. Further, the ability to perform multi-stage filtration with ease may enhance the cleanliness of the processing liquid.

Increasing the number of parallel filters belonging to one pump filter set allows for an increase in the flow rate of the processing liquid passing through that one pump filter set.

The number of pump filter sets 30 and 40 is not limited to 2 and may be 3 or more.

Another pump or another pump filter set may be provided downstream of the most downstream-side pump filter set 30 or 40.

Next, an operation method of the processing liquid supply system 1 of the liquid processing apparatus (particularly, an operating sequence from the stop state of the processing liquid supply system 1) will be described.

First, a first operating sequence will be described with reference to the time chart in FIG. 2. The time chart in FIG. 2 illustrates, in order from top, the rotation speed of the first pump 31 (0, low rotation speed L, or high rotation speed H), the rotation speed of the second pump 41 (0, low rotation speed L, or high rotation speed H), the state of the on-off valve 81 (OPEN or CLOSE), the control state of the back pressure valve 83 (fully open state (WO) or primary-side pressure control state (CTRL)), the state of the on-off valve 26A (OPEN or CLOSE), the state of the on-off valve 26B (OPEN or CLOSE), the state of the temperature regulator 50A (power-on (ON) or power-off (OFF)), the state of the temperature regulator 50B (power-on (ON) or power-off (OFF)), the control state of the back pressure valve 28A (fully open state (WO) or primary-side pressure control state (CTRL)), and the control state of the back pressure valve 28B (fully open state (WO) or primary-side pressure control state (CTRL)), respectively.

Figure 2:
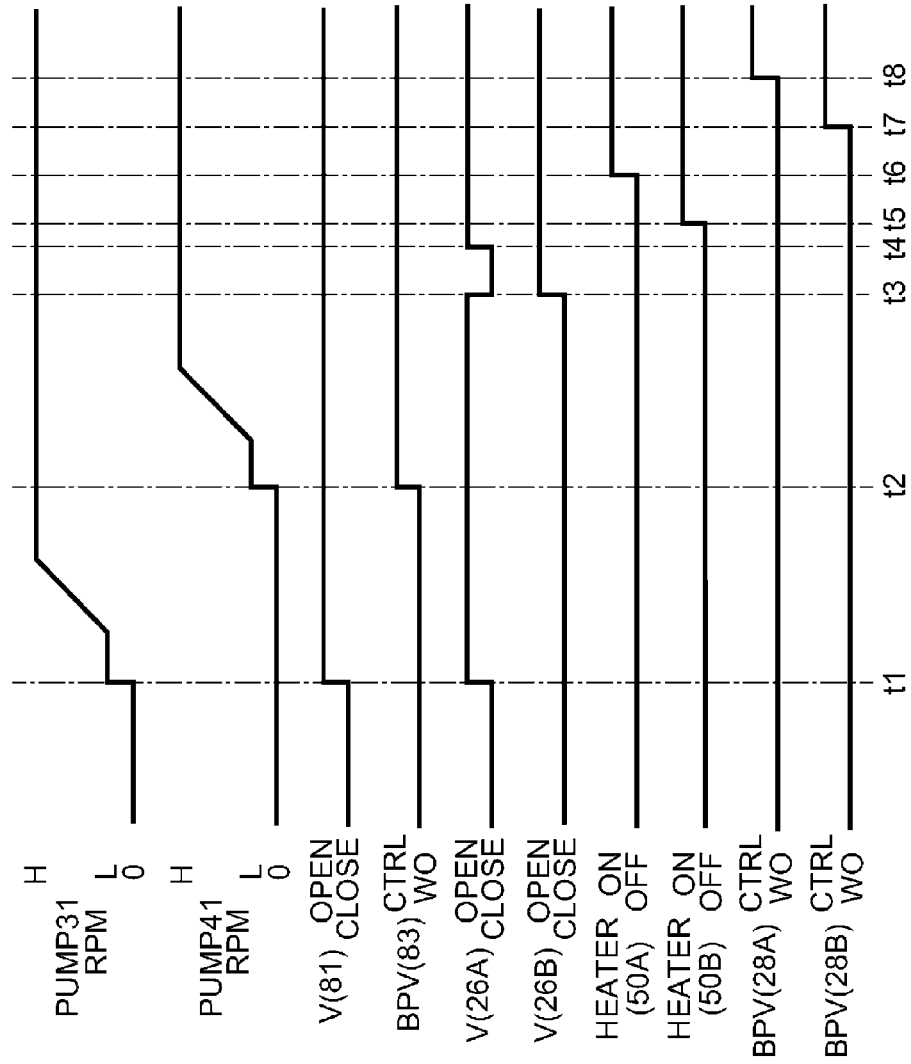
FIG. 2 is a time chart illustrating a first example of an operation method (operating sequence) of the processing liquid supply system.

At a time point slightly before time point t1 in FIG. 2, the excitation of the first and second pumps 31 and 41 is initiated. Then, the excitation of the first and second pumps 31 and 41 continues until the processing liquid supply system 1 is completely stopped. Through excitation, a rotor (vane) of the magnetic levitation type bearing-less centrifugal pump is levitated, and the rotor enters a standby state where it is capable of initiating rotation at any time.

At time point t1, the back pressure valve 28A of the first branch passage section 24A is set to the fully open state (WO) to open the on-off valves 26A and 27A (OPEN), and the back pressure valve 83 of the return passage 80 is set to the fully open state (WO) to open the on-off valve 81 (OPEN). The on-off valves 26B and 27B of the second branch passage section 24B remain closed (CLOSE). In this state, the operation (rotation) of the first pump 31 is initiated. The first pump 31 is initially rotated at an initial rotation speed (e.g., low rotation speed (L) of approximately 2,000 rpm) to discharge the processing liquid at a relatively small flow rate. Then, the first pump 31 is increased in speed to a normal operation rotation speed (e.g., high rotation speed (H) of approximately 7,000 rpm to 8,000 rpm) to discharge the processing liquid from the first pump 31 at a relatively large flow rate.

The above initial rotation speed is, for example, the minimum rotation speed required to draw the liquid into the first pump 31. Because increasing the speed of the first pump 31 from the initial rotation speed to the normal operation rotation speed takes a certain amount of time due to factors such as liquid resistance, the line representing the rotation speed of the pump in the speed increase process has a slope.

By executing the above sequence, a circulation flow of the processing liquid in a sub-circulation path is created, starting from the tank 10, then passing through the first pump filter set 30 and the return passage 80, and finally returning to the tank 10. This circulation flow continuously exists during the operation of the processing liquid supply system 1. Due to the presence of this circulation flow, the flow rate of the processing liquid passing through the first filters 32 per unit time may be increased, which may enhance the cleanliness of the processing liquid. In addition, at this time, the second pump 41 is not yet rotated, so that the processing liquid does not flow out at all or very little downstream of the second pump filter set 40.

Next, at time point t2, the operation (rotation) of the second pump 41 is initiated, and the back pressure valve 83 is transitioned from the fully open state (WO) to the primary-side pressure control state (CTRL), thereby controlling the flow rate of the processing liquid flowing in the return passage 80 to a predetermined flow rate lower than that when it was in the fully open state. This also allows the primary-side pressure of the second pump 41 to be maintained at a predetermined pressure. The primary-side setting pressure of the back pressure valve 83 at this time may be determined in consideration of the filtration efficiency by the first filters 32.

The fully open state (WO) of the back pressure valve 83 refers to a state where the opening degree of the back pressure valve 83 is fixed to the fully open state regardless of the primary-side pressure of the back pressure valve 83. The primary-side pressure control state (CTRL) refers to a state where the back pressure valve 83 functions to control the primary-side pressure thereof to a predetermined pressure. This is applied to the other back pressure valves 28A and 28B as well. In the fully open state WO, the opening degree of the back pressure valve 83 is not limited to fully open, but may be a large opening degree close to fully open. In the control of the back pressure valve 83, an opening degree greater than the maximum opening degree that may be adopted by the back pressure valve 83 in the primary-side pressure control state CTRL may be used instead of the opening degree for the full open state. This is applied to the other back pressure valves 28A and 28B as well.

The second pump 41 is initially rotated at an initial rotation speed (e.g., low rotation speed (L) of approximately 2,000 rpm) to discharge the processing liquid at a relatively small flow rate, and this state continues, for example, for approximately 30 seconds. Then, the second pump 41 is increased in speed to a normal operation rotation speed (e.g., high rotation speed (H) of approximately 7,000 rpm to 8,000 rpm) to discharge the processing liquid at a relatively large flow rate. The speed increase from the initial rotation speed to the normal operation rotation speed takes, for example, approximately 10 minutes.

While the first and second pumps 31 and 41 are operated (rotated) at the same time, the rotation speed (discharge flow rate) of the first pump 31 is set to be equal to or slightly higher than the rotation speed (discharge flow rate) of the second pump 41 (slightly higher is desirable). When the rotation speed (discharge flow rate) of the first pump 31 is set lower than the rotation speed (discharge flow rate) of the second pump 41, there is a risk of liquid interruption occurring on the primary side (suction side) of the second pump 41.

By executing the above sequence, the processing liquid driven by the second pump 41 passes through the second filters 42 and then enters the first branch passage section 24A. In other words, a circulation flow of the processing liquid is created, starting from the tank 10, then passing through the main passage section 22 and the first branch passage section 24A of the circulation passage 20, and finally returning to the tank 10. The flow rate of this circulation flow increases as the rotation speed of the second pump 41 increases.

Next, at time point t3 (after the second pump 41 is stabilized at the normal operation rotation speed), the on-off valves 26A and 27A of the first branch passage section 24A are closed (CLOSE), and the back pressure valve 28B of the second branch passage section 24B is set to the fully open state (WO) to open the on-off valves 26B and 27B (OPEN). Thus, a circulation flow of the processing liquid is created, starting from the tank 10, then passing through the main passage section 22 and the second branch passage section 24B of the circulation passage 20, and finally returning to the tank 10. At this time, the second branch passage section 24B is filled with the processing liquid and becomes a state where the flow has come to stop.

Next, at time point t4, the on-off valves 26A and 27A of the first branch passage section 24A are opened (OPEN). Thus, a flow of the processing liquid is created, passing through the main passage section 22 and then through both the first and second branch passage sections 24A and 24B of the circulation passage 20 and returning to the tank 10. At this time, the flow of the processing liquid is distributed to the first and second branch passage sections 24A and 24B, so that the flow rate of the processing liquid passing through each of the first and second branch passage sections 24A and 24B decreases.

At this time point, the processing liquid departed from the tank 10 is driven by the first pump 31 to pass through the first filters 32, and a part of the processing liquid having passed through the first filters 32 is returned to the tank 10 through the return passage 80. Meanwhile, the remaining part of the processing liquid having passed through the first filters 32 is driven by the second pump 41 to pass through the second filters 42 and return to the tank 10 after passing through the first and second branch passage sections 24A and 24B.

Subsequently, at time point t5, once the flow of the processing liquid in the second branch passage section 24B is stabilized, the temperature regulation of the processing liquid by the temperature regulator 50B is initiated (ON). Furthermore, at time point t6, once the flow of the processing liquid in the first branch passage section 24A is stabilized, the temperature regulation of the processing liquid by the temperature regulator 50A is initiated (ON). The temperature regulation of the processing liquid by the temperature regulators 50A and 50B may also be initiated at the same time.

Next, at time point t7, once the temperature of the processing liquid in the second branch passage section 24B is stabilized, the back pressure valve 28B of the second branch passage section 24B is transitioned from the fully open state (WO) to the primary-side pressure control state (CTRL). Further, at time point t8, once the temperature of the processing liquid in the first branch passage section 24A is stabilized, the back pressure valve 28A of the first branch passage section 24A is transitioned from the fully open state (WO) to the primary-side pressure control state (CTRL). Thus, the pressure in areas of the first and second branch passage sections 24A and 24B to which the supply passages 62 (62A and 62B) connected to the liquid processing units 60 (60A and 60B) are connected is controlled to a pressure suitable for supplying the processing liquid to the liquid processing units 60. This causes a slight decrease in the flow rate of the processing liquid flowing through the first and second branch passage sections 24A and 24B. The transition to the primary-side pressure control state of the back pressure valves 28A and 28B may be performed simultaneously.

Once the flow rate of the processing liquid in the first and second branch passage sections 24A and 24B is stabilized, it becomes possible to execute a processing in the liquid processing units 60 (60A and 60B). With the above, the entire operating sequence of the processing liquid supply system 1 is completed. Time points t7 and t8 may be the same time point.

Thereafter, the liquid processing unit 60 performs a liquid processing on the substrate according to a predetermined processing schedule.

Next, a second operating sequence will be described with reference to the time chart in FIG. 3. In the time chart in FIG. 3, an intermediate rotation speed M is added to the rotation speeds of the pumps 31 and 41.

Figure 3:
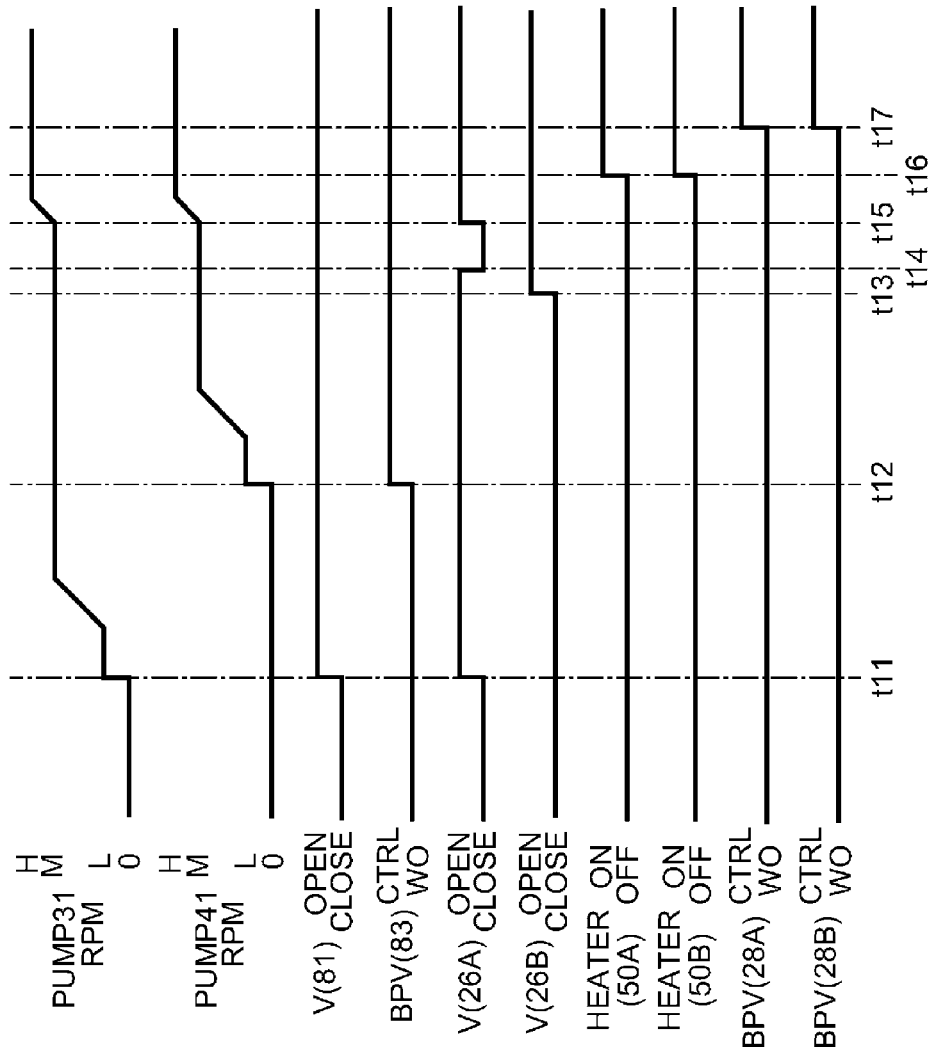
FIG. 3 is a time chart illustrating a second example of the operation method (operating sequence) of the processing liquid supply system.

At a time point slightly before time point t11 in FIG. 3, the excitation of the first and second pumps 31 and 41 is initiated. By excitation, the first and second pumps 31 and 41 enter a rotation standby state.

Further, at time point t11, the back pressure valve 28A of the first branch passage section 24A sets to the fully open state (WO) to open the on-off valves 26A and 27A (OPEN), and the back pressure valve 83 of the return passage 80 is set to the fully open state (WO) to open the on-off valve 81. The on-off valves 26B and 27B of the second branch passage section 24B remain closed (CLOSE). In this state, the operation (rotation) of the first pump 31 is initiated. The first pump 31 is initially rotated at an initial rotation speed (e.g., low rotation speed (L) of approximately 2,000 rpm) to discharge the processing liquid at a relatively small flow rate. Then, the first pump 31 is increased in speed to the intermediate rotation speed (M) (e.g., approximately 6,400 rpm) lower than the normal operation rotation speed (e.g., high rotation speed (H) of approximately 7,000 rpm to 8,000 rpm) to discharge the processing liquid at an intermediate discharge flow rate.

Thus, a circulation flow (sub-circulation flow) of the processing liquid in a sub-circulation path is created, starting from the tank 10, then passing through the first pump filter set 30 and the return passage 80 (first return passage 80), and finally returning to the tank 10.

Next, at time point t12, the operation (rotation) of the second pump 41 is initiated, and the back pressure valve 83 is transitioned to the primary-side pressure control state. Thus, the pressure in the return passage 80 is controlled to a predetermined pressure, and the primary-side pressure of the second pump 41 is also controlled to a predetermined pressure. The second pump 41 is initially rotated at an initial rotation speed (e.g., low rotation speed (L) of approximately 2,000 rpm) to discharge the processing liquid at a relatively small flow rate. Then, the second pump 41 is increased in speed to the intermediate rotation speed M (e.g., approximately 6,400 rpm) lower than the normal operation rotation speed (e.g., high rotation speed (H) of approximately 7,000 rpm to 8,000 rpm) to discharge the processing liquid at an intermediate discharge flow rate.

In this second sequence as well, similar to the first sequence, while the first and second pumps 31 and 41 are operated simultaneously, the rotation speed (discharge flow rate) of the first pump 31 is set to be equal to or higher than the rotation speed (discharge flow rate) of the second pump 41.

Thus, the processing liquid driven by the second pump 41 passes through the second filters 42 and then enters the first branch passage section 24A. In other words, a circulation flow of the processing liquid is created, starting from the tank 10, then passing through the main passage section 22 and the first branch passage section 24A of the circulation passage 20, and finally returning to the tank 10. The flow rate of this circulation flow increases as the rotation speed of the second pump 41 increases.

Next, at time point t13, the back pressure valve 28B of the second branch passage section 24B is set to the fully open state (WO) to open the on-off valves 26B and 27B (OPEN). Thus, the processing liquid flows from the main passage section 22 of the circulation passage 20 into both the first and second branch passage sections 24A and 24B, thus flowing toward the tank 10.

Next, at time point t14, the on-off valves 26A and 27A of the first branch passage section 24A are closed (CLOSE). Thus, while the processing liquid flows to the second branch passage section 24B, the first branch passage section 24A is filled with the processing liquid and becomes a state where the flow has come to stop. The time between time point t13 and time point t14 may be short. It may be important to ensure that there is no possibility of the simultaneous closure of the on-off valves 26A and 26B.

Next, at time point t15, the on-off valves 26A and 27A of the first branch passage section 24A are opened (OPEN). Thus, the processing liquid again flows from the main passage section 22 of the circulation passage 20 into both the first and second branch passage sections 24A and 24B, thus flowing toward the tank 10.

In other words, at this time point, the processing liquid departed from the tank 10 is driven by the first pump 31 to pass through the first filters 32, and a part of the processing liquid having passed through the first filters 32 is returned to the tank 10 through the return passage 80. Meanwhile, the remaining part of the processing liquid having passed through the first filters 32 is driven by the second pump 41 to pass through the second filters 42 and return to the tank 10 after passing through the first and second branch passage sections 24A and 24B.

The advantages of the sequence of time points t13 to t15 are as follows. In the above-described first operating sequence, the opening of the on-off valves 26B and 27B and the closing of the on-off valves 26A and 27A are performed almost simultaneously. This may lead to the occurrence of water hammer phenomenon, especially when the viscosity of the processing liquid is low, which may result in potential damage to components upstream of the on-off valve 26A. When the closing of the on-off valve 26A slightly precedes the opening of the on-off valve 26B, the generation of impact pressure due to the water hammer phenomenon becomes more pronounced. For example, when the temperature regulator 50A includes a lamp heater using a quartz tube, there is a risk of damage to the heater.

In contrast, in the second operating sequence, the opening (time point t13) of the on-off valves 26B and 27B precedes the closing (time point t14) of the on-off valves 26A and 27A. In other words, at the time point when the on-off valve 26A is closed, the flow rate (pressure) of the processing liquid flowing through the first branch passage section 24A has significantly decreased compared to before. Therefore, even when the aforementioned water hammer phenomenon occurs, the resulting apparatus damage is greatly minimized.

Further, in the second operating sequence, when the on-off valves 26B and 27B are opened and the on-off valves 26A and 27A are closed, the rotation speed of the first and second pumps 31 and 41 is lower than the rotation speed of the first and second pumps 31 and 41 during the same operations in the first operating sequence. Therefore, even when the aforementioned water hammer phenomenon occurs, the resulting apparatus damage is greatly minimized.

Furthermore, at time point t15, the on-off valves 26A and 27A are opened (OPEN), and the rotation speed of the first and second pumps 31 and 41 is increased from the intermediate rotation speed M (e.g., approximately 6,400 rpm) to the normal operation rotation speed (e.g., high rotation speed (H) of approximately 7,000 rpm to 8,000 rpm) to discharge the processing liquid the first and second pumps 31 and 41 at a relatively high flow rate.

Subsequently, at time point t16, once the flow of the processing liquid in the first and second branch passage sections 24A and 24B is stabilized to some degree, the temperature regulation of the processing liquid by the temperature regulators 50A and 50B is initiated (ON).

Next, at time point t17, once the temperature of the processing liquid in the first and second branch passage sections 24A and 24B is stabilized, the back pressure valve of the first branch passage section 24A and the back pressure valve 28B of the second branch passage section 24B are transitioned to the primary-side pressure control state (CTRL). Thus, the pressure in areas of the first and second branch passage sections 24A and 24B to which the supply passages 62 (62A and 62B) connected to the liquid processing units 60 (60A and 60B) are connected is controlled to a pressure suitable for supplying the processing liquid to the liquid processing units 60. This causes a slight decrease in the flow rate of the processing liquid flowing through the first and second branch passage sections 24A and 24B.

The transition from the fully open state (WO) to the primary-side pressure control state (CTRL) of the back pressure valves 28A and 28B is performed gradually over a period of, for example, about 30 seconds. To achieve this gradual transition, it is desirable to use a back pressure valve capable of receiving an external primary-side setting pressure command, or a back pressure valve capable of receiving an external opening degree command independently of primary-side pressure control. When using the back pressure valve capable of receiving an external primary-side setting pressure command, the gradual transition from the fully open state to the primary-side pressure control state may be accomplished, for example, by gradually increasing the primary-side pressure setting value of the back pressure valve to approach the final pressure setting value.

The back pressure valve used in the present disclosure has no structural limitations as long as it may control the primary-side pressure to a desired pressure. For example, a vale with a variable opening degree that controls the primary-side pressure to a desired pressure by feedback controlling the opening degree based on a detected signal from a pressure sensor used to detect the primary-side pressure may correspond to the back pressure valve of the present disclosure. Further, for example, a valve that mechanically controls the primary-side pressure based on a pneumatic pressure by supplying a controllable pneumatic pressure to a pilot port by an electropneumatic regulator may also correspond to the back pressure valve of the present disclosure.

Transitioning abruptly from the fully open state (WO) to the primary-side pressure control state (CTRL) of the back pressure valves 28A and 28B may result in a rapid increase in pressure within the first and second branch passage sections 24A and 24B. Similar to the aforementioned water hammer phenomenon, this rapid pressure increase also has the risk of causing damage to the components upstream of the back pressure valves 28A and 28B, and thus, it is desirable to avoid this.

Once the flow rate of the processing liquid in the first and second branch passage sections 24A and 24B is stabilized, it becomes possible to execute a processing in the liquid processing units 60 (60A and 60B). With the above, the entire operating sequence of the processing liquid supply system 1 is completed.

Thereafter, the liquid processing unit 60 performs a liquid processing on the substrate according to a predetermined processing schedule.

In the above two operating sequences, the second pump 41 is started after the first pump 31 reaches the normal operation rotation speed but is not limited thereto. For example, the second pump 41 may be started when a predetermined delay time has passed after the start of the first pump 31. In this case, for example, the second pump 41 may be started at a time point near the time point when the first pump 31 ends the initial rotation speed operation and transitions to the speed increase, and thereafter, the speed increase of the second pump 41 may be initiated after a predetermined delay time from the initiation of the speed increase of the first pump 31. In this case, for example, the processing liquid begins to flow to the first branch passage section 24A while the first pump 31 and the second pumps 41 are simultaneously increased in speed, but this does not pose any problem.

The processing liquid supply system 1 may also be provided with a second return passage 80' as represented by the broken line in FIG. 1. This second return passage 80' may be provided with, in order from upstream, an on-off valve, a flow meter, and a back pressure valve. By returning the processing liquid to the tank 10 through the second return passage 80', it is possible to increase the flow rate of the processing liquid passing through the second filters 42 per unit time, resulting in a further enhancement in the cleanliness of the processing liquid. Since the processing liquid supply system 1 may operate normally without having the first and second return passages 80 and 80', it is not necessary for the processing liquid supply system 1 to have both the first and second return passages 80 and 80'.

Figure 4:
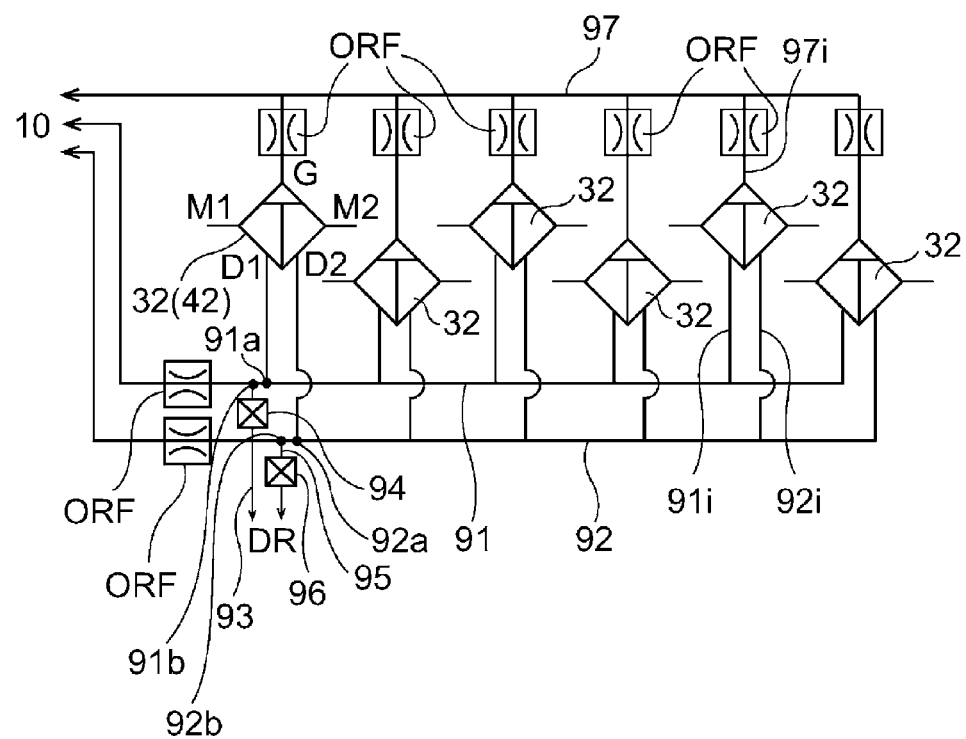
FIG. 4 is a piping layout diagram illustrating drain piping provided for a plurality of filters arranged in parallel.

Next, drain piping associated with the plurality of (six in FIG. 4) first filters 32 arranged in parallel will be described with reference to FIG. 4. In detail, each filter 32 is provided with a primary-side main port M1, a secondary-side main port M2, a primary-side drain port D1, a secondary-side drain port D2, and a gas discharge port G. The plurality of first filters 32 illustrated in FIG. 4 are connected in parallel as illustrated in FIG. 1, where only the primary-side main port M1 and the secondary-side main port M2 are visible.

A primary-side branch drain line 91i is connected to the primary-side drain port D1 of each filter 32. A plurality of primary-side branch drain lines 91i converge to form a primary-side main drain line 91. The primary-side main drain line 91 extends to the tank 10. At a connection point 91b provided slightly downstream of a connection point 91a between the primary-side main drain line 91 and the most downstream-side primary-side branch drain line 91i, a discharge line 93 is connected to the primary-side main drain line 91. The discharge line 93 is provided with an on-off valve 94. The primary-side main drain line 91 is provided with an orifice ORF downstream of the connection point 91b.

A secondary-side branch drain line 92i is connected to the secondary-side drain port D2 of each filter 32. A plurality of secondary-side branch drain lines 92i converge to form a secondary-side main drain line 92. The secondary-side main drain line 92 extends to the tank 10. At a connection point 92b provided slightly downstream of a connection point 92a between the secondary-side main drain line 92 and the most downstream-side secondary-side branch drain line 92i, a discharge line 95 is connected to the secondary-side main drain line 92. The discharge line 95 is provided with an on-off valve 96. The secondary-side main drain line 92 is provided with an orifice ORF downstream of the connection point 92b.

A gas discharge branch line 97i is connected to the gas discharge port G of each filter 32. A plurality of gas discharge branch lines 97i converge to form a gas discharge main line 97. The gas discharge main line 97 extends to the tank 10. Each gas discharge branch line 97i is provided with an orifice ORF.

During normal operation of the processing liquid supply system 1, when the processing liquid flows from the primary-side main port M1 to the secondary side main port M2 of each filter 32, a small amount of the processing liquid is discharged from the primary-side drain port D1 and the secondary-side drain port D2. Further, air bubbles contained in the processing liquid flowing from the primary-side main port M1 are discharged from the gas discharge port G together with a small amount of the processing liquid.

In a configuration example of FIG. 4, the on-off valves 94 and 96 are closed during normal operation of the processing liquid supply system 1. Therefore, the liquid discharged from the primary-side drain port D1 and the secondary-side drain port D2 of each filter 32 flows directly to the tank 10 without any retention. The dead volume in this drainage system includes only a region between the connection point 91b and the on-off valve 94 in the discharge line 93 and a region between the connection point 92b and the on-off valve 96 in the discharge line 95. Thus, in the configuration example of FIG. 4, there is no region where the liquid is retained other than the dead volume. When it is necessary to replace the liquid in the tank 10, the on-off valves 94 and 96 are opened to discharge the liquid retained in the dead volume.

The advantages of the configuration example of FIG. 4, compared to a conventional configuration example, will be described below. In the conventional configuration example, a drain line having an on-off valve is connected to each of the primary-side drain port D1 and the secondary-side drain port D2 of each filter 32. In a processing liquid supply system having this configuration, the liquid discharged from the primary-side drain port D1 and the secondary-side drain port D2 is retained in the drain lines. Particles contained in the liquid also accumulate in the drain lines. There is a risk of the liquid containing particles being drawn into filters through the drain lines, thus being mixed into the processing liquid passing through the filters.

The configuration example in FIG. 4 significantly mitigates this problem. This is because the liquid discharged from the primary-side drain port D1 and the secondary-side drain port D2 returns to the tank 10, thus then appropriately passing through a filtration element of the filter 32. There is no region where the liquid is retained other than the dead volume described above, and the total volume of the dead volume is small. Moreover, the possibility of the retained liquid returning to the filter 32 is minimal. Further, according to the configuration example in FIG. 4, it is possible to substantially reduce the number of on-off valves, which may lead to apparatus cost savings.

The configuration example in FIG. 4 is also applicable to the plurality of second filters 42.

The substrate is not limited to a semiconductor wafer and may be other types of substrates for use in the manufacture of semiconductor devices such as a glass substrate and a ceramic substrate.

According to the above embodiment of the present disclosure, it is possible to achieve a high level of cleanliness and discharge accuracy with a minimal number of components even when using a highly viscous chemical liquid.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing liquid supply system comprising:
 a tank configured to store a processing liquid supplied from a processing liquid supply;
 a circulation passage connected to the tank;
 a plurality of supply passages connected to the circulation passage and configured to supply the processing liquid to each of a plurality of liquid processing units that perform a liquid processing on a substrate;
 a first pump filter set that is a combination of a first pump and a plurality of first filters provided downstream of the first pump; and
 a second pump filter set that is a combination of a second pump and a plurality of second filters provided downstream of the second pump,
 wherein the first pump filter set and the second pump filter set are arranged in series in the circulation passage such that the first pump filter set is located upstream of the second pump filter set.

2. The processing liquid supply system according to claim 1, further comprising:
 a first return passage branched off from the circulation passage at a first branching point set between the first pump filter set and the second pump filter set, and configured to return the processing liquid flowing through the circulation passage to the tank.

3. The processing liquid supply system according to claim 2, wherein the circulation passage includes:
 a main passage section provided with the first pump filter set and the second pump filter set; and
 a first branch passage section and a second branch passage section branched off from the main passage section, and
 wherein the processing liquid discharged from the tank is configured to pass through the main passage section, enter the first branch passage section and the second branch passage section, and return to the tank through the first branch passage section and the second branch passage section.

4. The processing liquid supply system according to claim 3, further comprising:
 a second return passage branched off from the circulation passage downstream of the second pump filter set and upstream of a branching point where the main passage section branches into the first branch passage section and the second branch passage section, and configured to return the processing liquid flowing through the main passage section to the tank.

5. The processing liquid supply system according to claim 3, further comprising:

a first temperature regulator provided in the first branch passage section to regulate a temperature of the processing liquid flowing through the first branch passage section; and a second temperature regulator provided in the second branch passage section to regulate a temperature of the processing liquid flowing through the second branch passage section.

6. The processing liquid supply system according to claim 3, wherein the plurality of liquid processing units are grouped into a first processing unit group to which a plurality of liquid processing units belong and a second processing unit group to which a plurality of liquid processing units belong, and the plurality of supply passages are grouped into a first passage group to which a plurality of supply passages belong and a second passage group to which a plurality of supply passages belong, and wherein each of the liquid processing units belonging to the first processing unit group is connected to the first branch passage section via the supply passage belonging to the first passage group, and each of the liquid processing units belonging to the second processing unit group is connected to the second branch passage section through the supply passage belonging to the second passage group.

7. The processing liquid supply system according to claim 2, further comprising:

a controller, wherein at operation initiation of the processing liquid supply system the controller operates the first pump to create a first circulation flow of the processing liquid passing from the tank through the circulation passage, the first branching point, and the first return passage before returning to the tank, and then, while creating the first circulation flow, the controller operates the second pump to flow the processing liquid to the circulation passage downstream of the first branching point as well.

8. The processing liquid supply system according to claim 2, further comprising:

a controller; and a back pressure valve provided in the first return passage, wherein at operation initiation of the processing liquid supply system, the controller operates the first pump, while setting an opening degree of the back pressure valve to a fixed opening degree, to create a first circulation flow of the processing liquid passing from the tank through the circulation passage, the first branching point, and the first return passage before returning to the tank, and then, the controller operates the second pump while setting the back pressure valve to a pressure control state where a primary-side pressure of the back pressure valve is controlled to a desired pressure, and wherein the fixed opening degree is a fully open opening degree of the back pressure valve, or an opening degree greater than an opening degree of the back pressure valve at least in the pressure control state.

9. The processing liquid supply system according to claim 3, further comprising:

a first on-off valve provided in the first branch passage section;

a second on-off valve provided in the second branch passage section; and a controller, wherein at operation initiation of the processing liquid supply system, the controller initiates an operation at a first set flow rate by the first pump while the first on/off valve is open and the second on/off valve is closed, and then, initiates an operation at a second set flow rate equal to or less than the first set flow rate by the second pump, thereby flowing the processing liquid through the first branch passage section, and then, while the first pump is operated at the first set flow rate and the second pump is operated at the second set flow rate, the controller closes the first on-off valve and opens the second on-off valve, thereby flowing the processing liquid through the second branch passage section, and then, opens both the first on/off valve and the second on/off valve, thereby flowing the processing liquid through both the first branch passage section and the second branch passage section.

10. The processing liquid supply system according to claim 9, wherein, while both the first on-off valve and the second on-off valve are open and the processing liquid flows through both the first branch passage section and the second branch passage section, the controller increases the set flow rate of the first pump to a third set flow rate that is greater than the first set flow rate, and increases the set flow rate of the second pump to a fourth set flow rate that is greater than the second set flow rate and is equal to or less than the third set flow rate.

11. The processing liquid supply system according to claim 9, wherein, while the first pump is operated at the first set flow rate and the second pump is operated at the second set flow rate, when transitioning from a state where the first on-off valve is closed and the second on-off valve is open to a state where the first on-off valve is open and the second on-off valve is open, the controller performs the opening of the second on-off valve prior to the closing of the first on-off valve.

12. An operation method comprising:

providing a processing liquid supply system including;

a tank configured to store a processing liquid supplied from a processing liquid supply;

a circulation passage connected to the tank;

a plurality of supply passages connected to the circulation passage and configured to supply the processing liquid to each of a plurality of liquid processing units that perform a liquid processing on a substrate;

a first pump filter set that is a combination of a first pump and a plurality of first filters provided downstream of the first pump; and a second pump filter set that is a combination of a second pump and a plurality of second filters provided downstream of the second pump, wherein the first pump filter set and the second pump filter set are arranged in series in the circulation passage such that the first pump filter set is located upstream of the second pump filter set, wherein the processing liquid supply system further includes a first return passage branched off from the circulation passage at a first branching point set between the first pump filter set and the second pump filter set to return the processing liquid flowing through the circulation passage to the tank;

at operation initiation of the processing liquid supply system, operating the first pump to create a first circulation flow of the processing liquid passing from the tank through the circulation passage, the first branching point, and the first return passage before returning to the tank; and then, while creating the first circulation flow, operating the second pump to flow the processing liquid to the circulation passage downstream of the first branching point as well.

13. The operation method according to claim 12, wherein the processing liquid supply system further includes a back pressure valve provided in the first return passage, wherein the operation method further comprises:

at operation initiation of the processing liquid supply system, operating the first pump, while setting an opening degree of the back pressure valve to a fixed opening degree, to create a first circulation flow of the processing liquid passing from the tank through the circulation passage, the first branching point, and the first return passage before returning to the tank, and then, operating the second pump while setting the back pressure valve to a pressure control state where a primary-side pressure of the back pressure valve is controlled to a desired pressure, and wherein the fixed opening degree is a fully open opening degree of the back pressure valve, or an opening degree greater than an opening degree of the back pressure valve at least in the pressure control state.

14. An operation method comprising:

providing a processing liquid supply system including:
 a tank configured to store a processing liquid supplied from a processing liquid supply;
 a circulation passage connected to the tank;
 a plurality of supply passages connected to the circulation passage and configured to supply the processing liquid to each of a plurality of liquid processing units that perform a liquid processing on a substrate;
 a first pump filter set that is a combination of a first pump and a plurality of first filters provided downstream of the first pump; and
 a second pump filter set that is a combination of a second pump and a plurality of second filters provided downstream of the second pump, wherein the first pump filter set and the second pump filter set are arranged in series in the circulation passage such that the first pump filter set is located upstream of the second pump filter set, wherein the circulation passage includes: a main passage section provided with the first pump filter set and the second pump filter set; and first and second branch passage section and a second branch passage section branched off from the main passage section, and the processing liquid discharged from the tank is configured to pass through the main passage section, then enter the first branch passage section and the second branch passage section, and return to the tank through the first branch passage section and the second branch passage section, wherein the processing liquid supply system further comprises a first on-off valve provided in the first branch passage section, a second on-off valve provided in the second branch passage section;

at operation initiation of the processing liquid supply system, initiating an operation at a first set flow rate by the first pump while the first on/off valve is open and the second on/off valve is closed, and then, initiating an operation at a second set flow rate, equal to or less than the first set flow rate, by the second pump, thereby flowing the processing liquid through the first branch passage section, and then, while the first pump is operated at the first set flow rate and the second pump is operated at the second set flow rate, closing the first on-off valve and opening the second on-off valve, thereby flowing the processing liquid through the second branch passage section, and then, opening both the first on/off valve and the second on/off valve, thereby flowing the processing liquid through both the first branch passage section and the second branch passage section.

* * * * *